(12) United States Patent
Oka et al.

(10) Patent No.: US 10,068,819 B2
(45) Date of Patent: Sep. 4, 2018

(54) SEMICONDUCTOR DEVICE

(71) Applicant: Mitsubishi Electric Corporation, Tokyo (JP)

(72) Inventors: Seiji Oka, Tokyo (JP); Hiroshi Yoshida, Tokyo (JP); Hidetoshi Ishibashi, Tokyo (JP); Yuji Imoto, Tokyo (JP); Daisuke Murata, Tokyo (JP); Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/430,695

(22) Filed: Feb. 13, 2017

(65) Prior Publication Data
US 2017/0372978 A1    Dec. 28, 2017

(30) Foreign Application Priority Data

Jun. 23, 2016 (JP) ................. 2016-124711

(51) Int. Cl.
H01L 23/00     (2006.01)
H01L 23/10     (2006.01)
H01L 23/057    (2006.01)
H01L 23/31     (2006.01)
H01L 25/07     (2006.01)
H01L 21/52     (2006.01)
H01L 21/48     (2006.01)
H01L 21/56     (2006.01)
H02M 7/537     (2006.01)

(52) U.S. Cl.
CPC .......... H01L 23/10 (2013.01); H01L 21/4817 (2013.01); H01L 21/52 (2013.01); H01L 21/565 (2013.01); H01L 23/057 (2013.01); H01L 23/3114 (2013.01); H01L 25/071 (2013.01); H02M 7/537 (2013.01)

(58) Field of Classification Search
None
See application file for complete search history.

(56) References Cited

FOREIGN PATENT DOCUMENTS

JP    2015-162649 A    9/2015
WO    2017/130381 A1   8/2017

Primary Examiner — Reema Patel
(74) Attorney, Agent, or Firm — Studebaker & Brackett PC

(57) ABSTRACT

A relay substrate in which a circuit pattern and an external electrode are integrated on a insulating plate is used in the semiconductor device. Such configuration makes it possible to reduce a resistance in a current path while preventing the problems occurring when the external electrode is soldered on the semiconductor chip.

9 Claims, 6 Drawing Sheets

SEMICONDUCTOR DEVICE

BACKGROUND OF THE INVENTION

Field of the Invention

The present invention relates to a semiconductor device used for controlling high current, for example.

Background Art

For example, semiconductor devices that include an insulated gate bipolar transistor (IGBT) and are used to control high current have been available. When a wiring material such as an aluminum wire is used for internal wiring in such a semiconductor device, joint reliability such as a power cycle cannot be sufficiently achieved.

In a configuration disclosed in Japanese laid-open patent publication No. 2015-162649, a higher reliability is achieved with a lead terminal directly soldered on a device soldered on a substrate. The lead terminal serves as an external electrode extending outside the device.

In many cases, the external electrode exposed outside the semiconductor device is formed by punching a single metal sheet with a mold or the like. When the external electrode is soldered on a semiconductor chip, smaller resistance can be achieved in a current path extending from the semiconductor chip to the outside via the external electrode, compared with a configuration where some sort of member is interposed between the external electrode and the semiconductor chip.

Unfortunately, the configuration in which the external electrode is soldered on the semiconductor chip involves various problems. For example, a plurality of external electrodes joined to the semiconductor chip form two-dimensional wiring with a low degree of freedom of wiring, lead to a larger outer size of the semiconductor device. When the plurality of external electrodes and the semiconductor chip are concurrently soldered, a uniform height of the plurality of external electrodes is difficult to achieve. Furthermore, the external electrodes that are formed to have a certain level of thickness to guarantee a certain level of strength cannot be easily and accurately soldered on a small area portion such as a signal pad of the semiconductor chip.

SUMMARY OF THE INVENTION

The present invention is made to solve the problem described above, and an object of the present invention is to provide a semiconductor device with which a small resistance can be achieved in a current path while preventing the problems occurring when an external electrode is soldered on a semiconductor chip.

The features and advantages of the present invention may be summarized as follows.

According to one aspect of the present invention, a semiconductor device includes a substrate, a plurality of semiconductor chips fixed on the substrate, an insulating plate in which a through hole is formed, a first lower portion conductor as a single conductor including a lower portion main body that is formed on a lower surface of the insulating plate and is electrically connected to one of the plurality of semiconductor chips, and a lower portion protruding portion that extends outside the insulating plate in plan view, a second lower portion conductor that is formed on a lower surface of the insulating plate and is electrically connected to one of the plurality of semiconductor chips, an upper portion conductor as a single conductor including an upper portion main body formed on the upper surface of the insulating plate, and an upper portion protruding portion extending outside the insulating plate in plan view, a connecting portion provided in the through hole and connects between the upper portion main body and the second lower portion conductor, and resin that covers the semiconductor chips and the insulating plate, wherein the lower portion protruding portion and the upper portion protruding portion extend outside the resin.

Other and further objects, features and advantages of the invention will appear more fully from the following description.

DETAILED DESCRIPTION OF THE PREFERRED EMBODIMENTS

Figure 1:
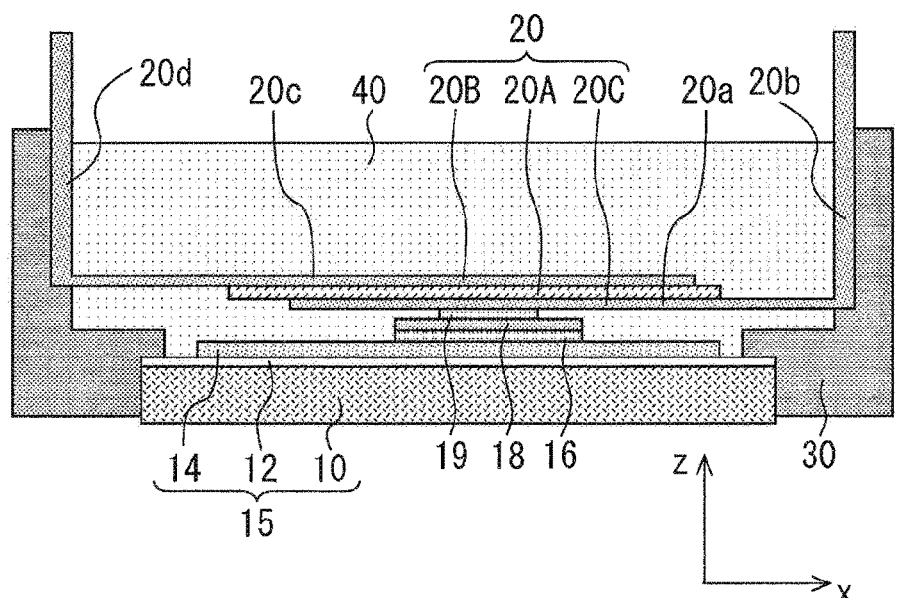
FIG. 1 is a cross-sectional view of a semiconductor device according to Embodiment 1.

Semiconductor devices according to embodiments of the present invention are described with reference to the drawings. The same or corresponding components are denoted with the same reference numerals, and redundant description may be omitted.

Embodiment 1

FIG. 1 is a cross-sectional view of a semiconductor device according to Embodiment 1 of the present invention. The semiconductor device includes a substrate 15. The substrate 15 includes: a base plate 10 made of metal; an insulating layer 12 disposed on the base plate 10; and a circuit pattern 14 formed on a surface of the insulating layer 12. For example, the insulating layer 12 may be made of an inorganic ceramic material, or may be made of a material containing thermoset resin, such as epoxy resin, in which ceramic powder is dispersed. The substrate 15 and semiconductor chips 18 are fixed to each other with solder 16. The semiconductor chips 18 are soldered on the circuit pattern 14 on their back surface. A plurality of semiconductor chips 18 are provided.

The semiconductor chips 18, examples of which may include a transistor chip, such as an insulated gate bipolar transistor (IGBT) and a diode chip, are not particularly limited. For example, each of the transistor chips 18 has a lower surface provided with a collector and an upper surface provided with an emitter and a gate. When a three-phase inverter circuit is formed with the semiconductor device, six transistor chips and six diodes in reverse connection with the transistor chips are provided.

A relay substrate 20 is provided on the semiconductor chip 18. The relay substrate 20 includes: an insulating plate 20A; an upper portion conductor 20B formed on an upper surface side of the insulating plate 20A; and a first lower portion conductor 20C formed on a lower surface side of the insulating plate 20A. For example, the insulating plate 20A is made of glass epoxy, a polyimide film used for a flexible printed circuit board, or ceramic. The insulating plate 20A has a thickness defined by the rated voltage of the semiconductor device.

The first lower portion conductor 20C includes a lower portion main body 20a and a lower portion protruding portion 20b. The lower portion main body 20a is formed on a lower surface of the insulating plate 20A. The upper surface of the semiconductor chip 18 is soldered on the lower portion main body 20a with solder 19. The lower portion protruding portion 20b extends outside the insulating plate 20A in plan view. The lower portion protruding portion 20b includes a portion extending in an x direction and a portion extending in a z direction to have a bent shape. The lower portion main body 20a and the lower portion protruding portion 20b are formed of a single seamless conductor. For example, the first lower portion conductor 20C is formed by attaching a single piece of conductor that has been bent on the lower surface of the insulating plate 20A. Alternatively, the first lower portion conductor 20C may be formed by attaching the single piece of conductor before being bent on the lower surface of the insulating plate 20A. For example, the first lower portion conductor 20C has a thickness of 0.2 mm or larger.

The upper portion conductor 20B includes an upper portion main body 20c and an upper portion protruding portion 20d. The upper portion main body 20c is formed on an upper surface of the insulating plate 20A. The upper portion protruding portion 20d extends outside the insulating plate 20A in plan view. The upper portion protruding portion 20d includes a portion extending in the x direction and a portion extending in the z direction to have a bent shape. The upper portion main body 20c and the upper portion protruding portion 20d are formed of a single seamless conductor. For example, the upper portion conductor 20B is formed by attaching a single piece of conductor that has been bent on the upper surface of the insulating plate 20A. Alternatively, the upper portion conductor 20B may be formed by attaching the single piece of conductor before being bent on the upper surface of the insulating plate 20A. For example, the upper portion conductor 20B has a thickness of 0.2 mm or larger.

The insulating plate 20A, the semiconductor chip 18, and the like are surrounded by a casing 30. The casing 30 is made of thermoplastic resin or the like. The casing 30 has an inner portion filled with resin 40. The resin 40, examples of which include epoxy resin, is not particularly limited as long as it is an insulative material. The resin 40 covers the semiconductor chip 18 and the insulating plate 20A. The lower portion protruding portion 20b and the upper portion protruding portion 20d are partially covered with the resin 40 and partially extend outside the resin 40. Thus, the upper portion conductor 20B and the first lower portion conductor 20C serve as external electrodes exposed outside the semiconductor device.

Figure 2:
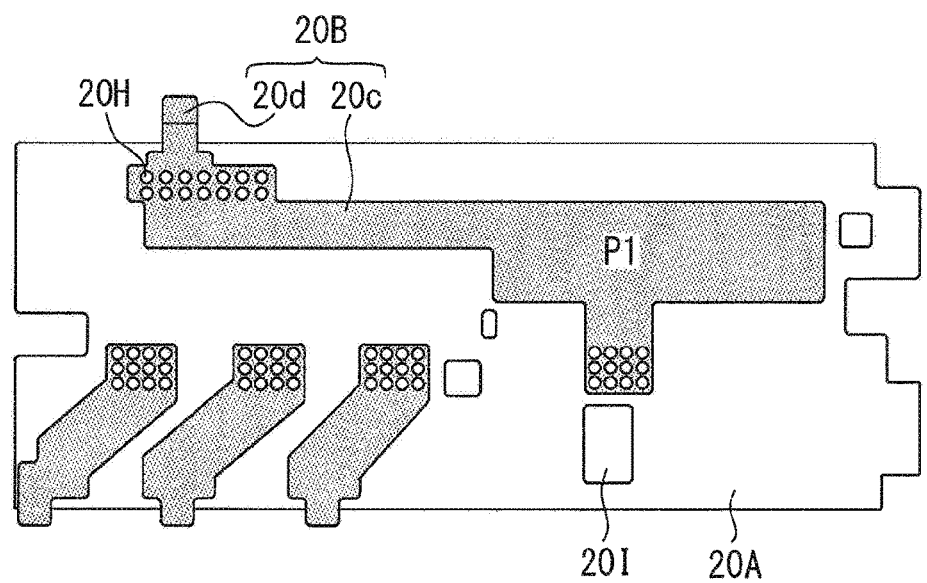
FIG. 2 is a plan view of the relay substrate.

FIG. 2 is a plan view of the relay substrate 20. A sign "P1" written on the upper portion conductor 20B indicates that the upper portion conductor 20B is used as a P phase pattern.

The upper portion protruding portion 20d is a part of the upper portion conductor 20B extending outside beyond the outer circumference of the insulating plate 20A. A plurality of the upper portion conductors 20B may be formed. A through hole 20H formed through the relay substrate 20 is formed at a portion of the insulating plate 20A where the upper portion conductor 20B is provided. An insulating plate opening 20I is provided at a portion of the insulating plate 20A where the upper portion conductor 20B is absent. The insulating plate opening 20I is filled with the resin 40.

Figure 3:
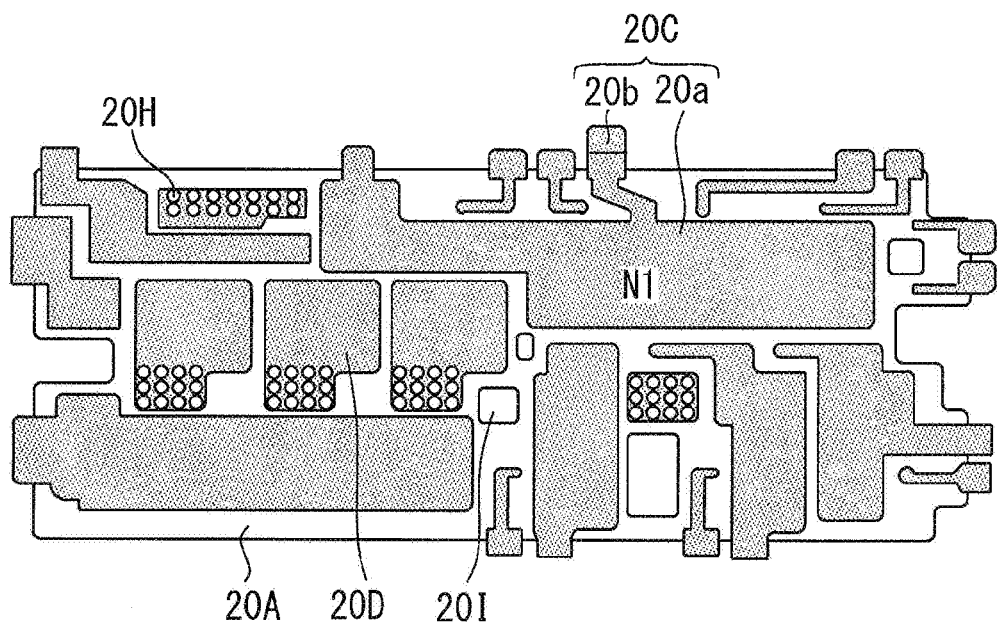
FIG. 3 is a bottom view of the relay substrate.

FIG. 3 is a bottom view of the relay substrate 20. A sign "N1" written on the first lower portion conductor 20C indicates that the first lower portion conductor 20C is used as an N phase pattern. The lower portion protruding portion 20b is a part of the first lower portion conductor 20C protruding outside beyond the outer circumference of the insulating plate 20A. A plurality of the first lower portion conductors 20C may be formed. Besides the first lower portion conductor 20C, a second lower portion conductor 20D is formed on the lower surface of the insulating plate 20A. The second lower portion conductor 20D has no protruding portion protruding outside beyond the outer circumference of the insulating plate 20A in plan view. Thus, the second lower portion conductor 20D is formed only within the lower surface of the insulating plate 20A. The second lower portion conductor 20D is soldered on a semiconductor chip that is soldered on the substrate 15 but not illustrated in FIG. 1.

A plurality of the second lower portion conductors 20D are provided. For example, the emitter, the collector, or the gate of a transistor chip or the anode or the cathode of a diode chip is soldered on the lower portion main body 20a and the second lower portion conductor 20D. For example, the emitter is soldered on the lower portion main body 20a when the lower portion main body 20a is used as an N phase pattern. The second lower portion conductor 20D and the circuit pattern 14 are soldered when the lower portion conductor 20B is used as a P phase pattern.

Figure 4:
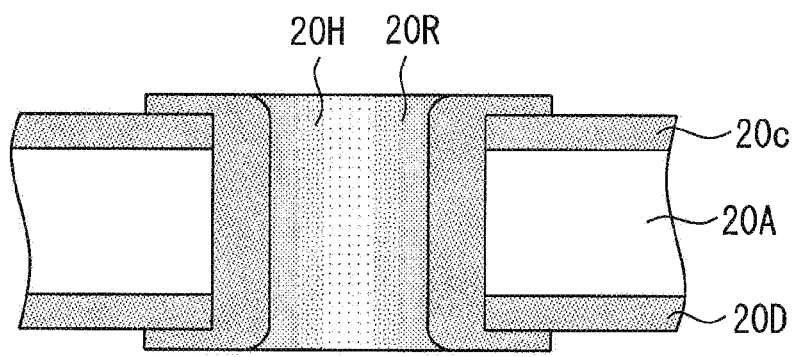
FIG. 4 is a cross-sectional view of a portion around the through hole.

The through hole 20H is formed at a portion of the insulating plate 20A where the second lower portion conductor 20D is provided. The through hole 20H in FIG. 3 is the through hole 20H in FIG. 2. FIG. 4 is a cross-sectional view of a portion around the through hole 20H. In through hole 20H a connecting portion 20R with which the upper portion main body 20c and the second lower portion conductor 20D are connected to each other is provided. The connecting portion 20R, examples of which include a copper plating layer, is not particularly limited as long as it can electrically connect the upper portion main body 20c with the second lower portion conductor 20D. When a copper plating layer with a thickness of about 15 to 75 μm is formed, a large number of through holes provided with the copper plating layer are need to be provided so that high current can flow. For example, current of 10 A flows in the copper plating layer having a thickness of 50 μm provided to a single through hole 20H.

The connecting portion 20R is preferably formed by pressure-welding a metal member, so that the number of through holes 20H to be formed can be prevented from being large. More specifically, the connecting portion 20R is formed with an eyelet deformed by pressure and then caulked. Thus, high current can flow with a smaller number of through holes 20H, compared with a case where the connecting portion 20R is formed by plating.

Figure 5:
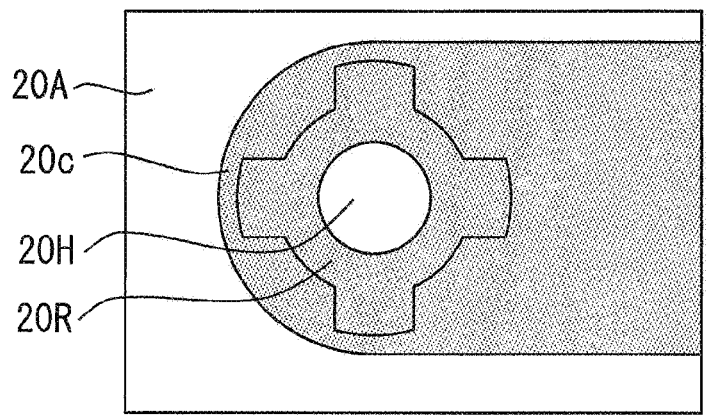
FIG. 5 is a plan view of the portion around the through hole.
Figure 6:
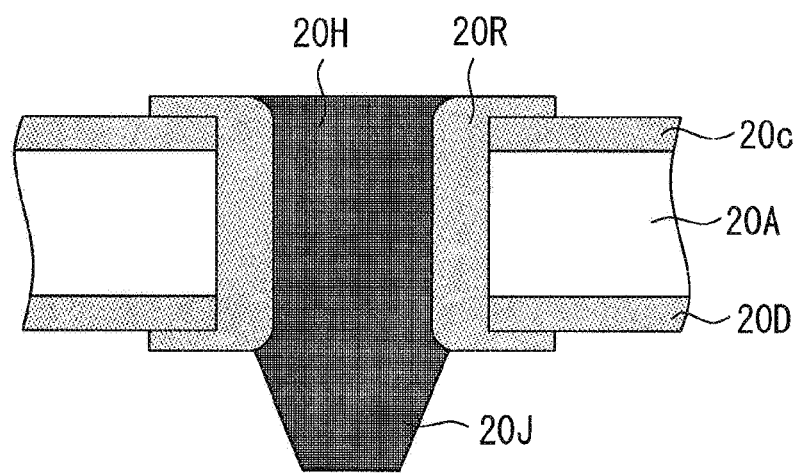
FIG. 6 is a cross-sectional view of a portion around the through hole.

FIG. 5 is a plan view of the connecting portion 20R. The connecting portion 20R is preferably formed with an eyelet deformed by pressure and caulked as described above. The metal member forming the connecting portion 20R thus does not fill the through hole 20H. The through hole 20H may be filled with metal, so that an even higher current capacity can be achieved. FIG. 6 illustrates a cross-sectional view of a portion around the through hole 20H in a state where the through hole 20H is filled with a filling metal member 20J. The filling metal member 20J is in contact with the connecting portion 20R and fills the through hole 20H. For example, the filling metal member 20J is formed by running metal such as a soldering member into the through hole 20H.

The filling metal member 20J preferably protrudes toward the semiconductor chip 18. The protruding filling metal member 20J can be used as a reference for positioning when the second lower portion conductor 20D is brought into electrical contact with the small area portion, such as a signal pad of the semiconductor chip 18. Thus, misalignment can be prevented.

Figure 7:
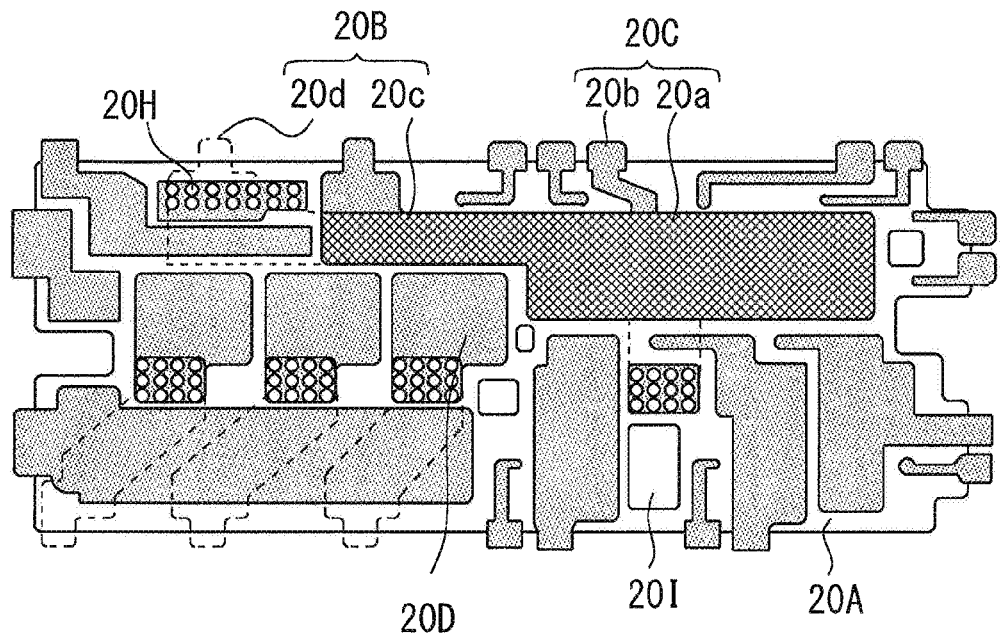
FIG. 7 shows P phase pattern and N phase pattern.

FIG. 7 is a diagram with a contour of the upper portion conductor 20B added to the bottom view of the relay substrate 20. Contour of the upper portion conductor 20B is indicated by broken line. A cross-hatched area represents an area where the lower portion main body 20a and the upper portion main body 20c overlap in plan view. When a transistor chip is provided as the semiconductor chip 18, collector current of the transistor chip flows in one of the lower portion main body 20a and the upper portion main body 20c, and emitter current of the transistor chip flows in the other one of the lower portion main body 20a and the upper portion main body 20c. Lower internal inductance of the semiconductor device can be achieved with the collector current and the emitter current of the transistor chip flowing in opposite directions in plan view, in the portion where the lower portion main body 20a and the upper portion main body 20c overlap in plan view.

A method of manufacturing the semiconductor chip according to Embodiment 1 of the present invention is described with reference to FIG. 1. First of all, the semiconductor chip 18 is fixed on the substrate 15 with the solder 16. Then, the casing 30 is fixed to the substrate 15. Next, the relay substrate 20 is moved toward the semifinished product, and the lower portion protruding portion 20b and the upper portion protruding portion 20d slide along a groove on the casing 30. Then, the relay substrate 20 is fixed to the semiconductor chip 18 with the solder 19. The semiconductor chip 18 and the relay substrate 20 are connected to each other with a plurality of pieces of solder different from the solder 19. For example, a conductor formed on the lower surface of the insulating plate 20A is connected to the circuit pattern 14 with solder. The semiconductor device can be prevented from being thick with the solder 19 connecting between the semiconductor chip 18 and the lower portion main body 20a or the second lower portion conductor 20D having a thickness of 1 mm or smaller.

Next, the resin 40 is injected in the casing 30, and the semiconductor device illustrated in FIG. 1 is completed. The inner portion of the casing 30 needs to be filled with the resin 40 without any gap to guarantee sufficient insulating property of the semiconductor device.

For example, when the insulating plate 20A is large and there is almost no gap between the relay substrate 20 and the casing 30, the relay substrate 20 makes the injected resin 40 difficult to reach a portion below the relay substrate 20. Thus, in Embodiment 1 of the present invention, the insulating plate opening 201 is formed in the insulating plate 20A as illustrated in FIG. 2. The resin 40 easily flows from a portion above the relay substrate 20 to the portion below the relay substrate 20 through the insulating plate opening 201. The insulating plate opening 201 preferably has a width that is at least three times as large as the thickness of the insulating plate 20A so that the resin 40 can be smoothly supplied to the portion below the relay substrate 20.

Figure 8:
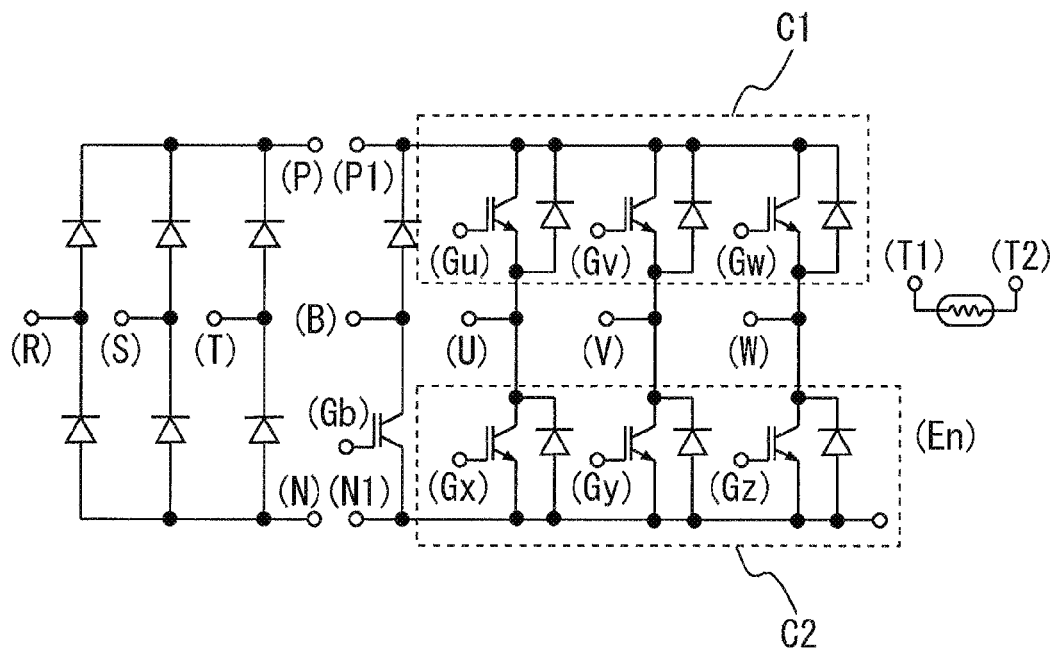
FIG. 8 is a circuit diagram of the semiconductor device.

FIG. 8 is a circuit diagram of the semiconductor device according to Embodiment 1 of the present invention. A converter circuit, an inverter circuit, and a braking circuit are formed with the plurality of semiconductor chips 18 including the transistor chip and the diode chip provided. The inverter circuit includes a P phase circuit portion C1 and an N phase circuit portion C2. It is a matter of course that a circuit different from that in FIG. 8 may be used.

High current flows in the transistor chip and the diode chip. For example, the lower portion main body 20a or the second lower portion conductor 20D is electrically connected to a terminal such as the collector, the emitter, or the like of the IGBT in which the high current flows. Thus, the current can flow outside from the semiconductor chip 18 through the upper portion conductor 20B or the first lower portion conductor 20C, which is a seamless member with a low resistance. As described above, main current of the device preferably flows in the upper portion conductor 20B or the first lower portion conductor 20C. Any suitable number of the upper portion conductor 20B, the first lower portion conductor 20C, and the second lower portion conductor 20D are provided.

The semiconductor device according to Embodiment 1 of the present invention includes the conductors on the upper and lower surfaces of the relay substrate 20. Thus, three-dimensional wiring can be achieved with the conductors. Thus, the wiring is less limited compared with the configuration where external electrodes are directly fixed to the semiconductor chip. All things considered, a small outer size of the semiconductor device can be achieved.

The semiconductor device according to Embodiment 1 of the present invention includes the upper portion conductor 20B and the first lower portion conductor 20C as the external electrodes. All the external electrodes extend outside the insulating plate 20A in plan view, and thus the semifinished product including the external electrodes can be easily attached to the casing 30.

The conductors formed on the relay substrate 20 may include a signal circuit portion where low current flows and a main circuit portion where high current of several tens of amperes or more flows that are made of different materials. For example, the conductor for a signal may be made of a brass-based material, and the conductor for the main circuit may be made of a pure copper-based material. For example, when the lower portion main body 20a and the second lower portion conductor 20D are electrically connected to the collector or the emitter of the transistor chip, the first lower portion conductor 20C, the second lower portion conductor 20D, and the upper portion conductor 20B are made of a highly conductive material, such as a pure copper-based material. Aluminum may be used to achieve a lower cost. Alternatively, the conductors formed on the insulating plate 20A may include a thin conductor for a signal and a thick conductor for the main circuit.

The conductor provided on the lower surface of the insulating plate 20A is soldered on the gate of the semiconductor chip 18, and the conductor extends outside the device, whereby a signal can be provided to the gate from the outside.

The P and N phase patterns can be provided in parallel with each other as illustrated in FIG. 7, with the P phase circuit portion provided on the upper surface side of the relay substrate 20 and the N phase circuit portion provided on the lower surface side of the relay substrate 20. Thus, an attempt to reduce inductance can be facilitated. The inductance in a package can be further reduced with no wire connection employed in the semiconductor device.

The semiconductor device according to Embodiment 1 of the present invention can be modified in various ways as long as its features can be retained. The relay substrate 20 can be modified as long as three-dimensional wiring is achieved. For example, the conductors in three layers or more may be provided with the relay substrate to achieve an even higher degree of freedom of wiring. In such a configuration, the conductors of three layers are provided with an insulating plate additionally provided on the upper portion conductor 20B and a conductor provided on the insulating plate. When the conductors of three layers or more are provided with the relay substrate, lower inductance can be achieved with the P and N side circuit patterns separately provided on upper and lower layers adjacent to each other.

When a sufficient space is provided between the relay substrate 20 and an inner wall of the casing 30, the insulating plate opening 201 may be omitted. The circuit including the plurality of semiconductor chips 18 is not limited to the circuit illustrated in FIG. 8. For example, a half bridge circuit may be formed. The semiconductor chip is not limited to a vertical device in which current flows between the upper and lower surfaces, and may be a horizontal device in which current flows between two points on the chip upper surface.

The components may be bonded to each other via something other than solder and any conductive bonding material may be used. The conductive bonding material is preferably solder, metal paste using a metal filler, or low electric resistance metal such as sinterable metal metalized by heat. The height of the solder 19 and the solder connecting between the circuit pattern and the relay substrate 20 need to be large enough to guarantee the insulation between the semiconductor chip 18 and the circuit pattern on the relay substrate 20, but also need to be small enough to achieve lower inductance. For example, the inductance reducing effect can be achieved with the solder 19 having a thickness of 1 mm or smaller. Almost no inductance reducing effect can be achieved when the thickness exceeds 1 mm.

The main current may flow in any one of the upper portion conductor 20B and the first lower portion conductor 20C, and the other one of the upper portion conductor 20B and the first lower portion conductor 20C may be a signal circuit. The thickness of the conductor formed on the insulating plate 20A may be determined based on the current capacity.

Such modifications may be applied to semiconductor devices according to embodiments described below. The semiconductor devices according to embodiments described below have many things in common with the semiconductor device according to Embodiment 1 of the present invention. Thus, the differences from Embodiment 1 are mainly described.

Embodiment 2

Figure 9:
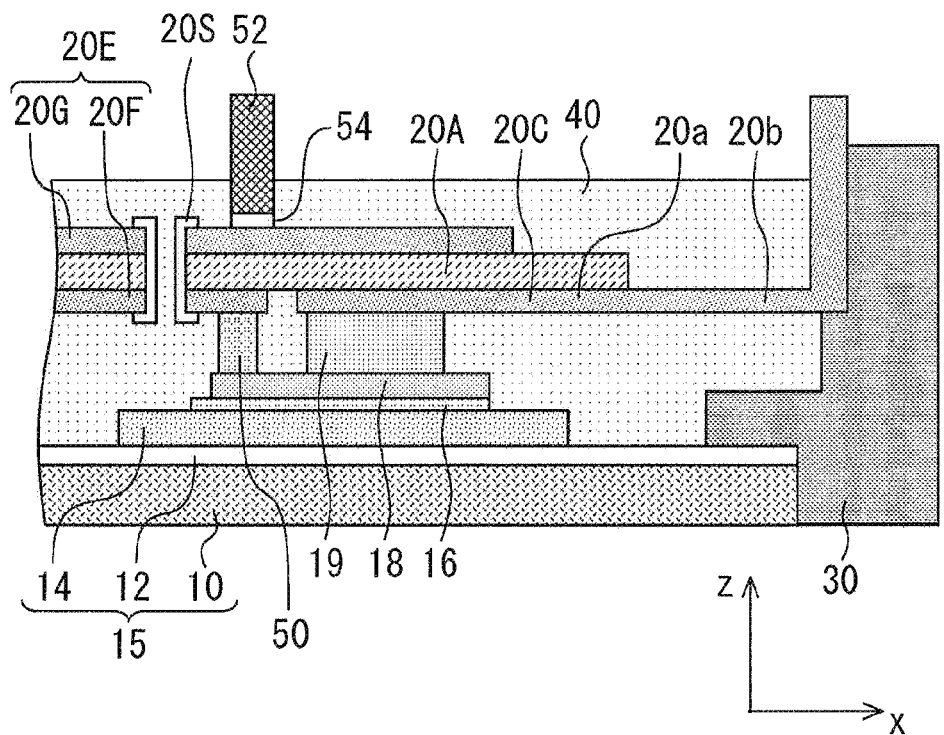
FIG. 9 is a partial cross sectional view of a semiconductor device according to Embodiment 2.

FIG. 9 is a partial cross-sectional view of a semiconductor device according to Embodiment 2. The semiconductor chip 18 is a transistor chip having a lower surface provided with a collector and an upper surface provided with an emitter and a gate. The emitter is connected to the lower portion main body 20a with the solder 19.

A gate pattern 20E is formed on the insulating plate 20A. The gate pattern 20E includes: a first portion 20F formed on a lower surface of the insulating plate 20A; and a second portion 20G formed on the upper surface of the insulating plate 20A. The first and the second portions 20F and 20G are connected to each other via a connecting portion 20S. The connecting portion 20S connects between the conductors on upper and lower sides of the insulating plate 20A as in the case of the connecting portion 20R described above.

Figure 10:
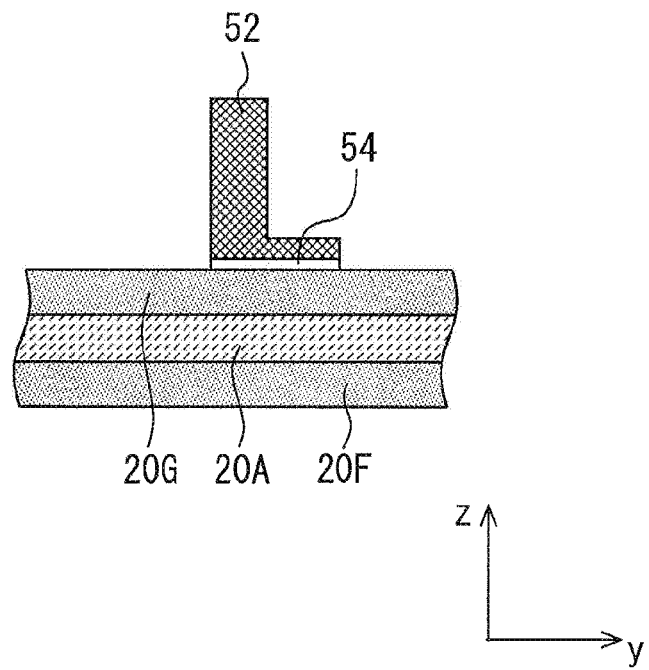
FIG. 10 is a view of the gate lead-out portion.

The first portion 20F is electrically connected to the gate of the semiconductor chip 18 with solder 50. A gate lead-out portion 52 is fixed to the second portion 20G via solder 54 provided on the second portion 20G. The gate lead-out portion 52 is a conductor elongated in the z direction, and extends outside the resin 40. FIG. 10 is an enlarged view of the gate lead-out portion 52. As illustrated in FIG. 10, the gate lead-out portion 52 has a wide lower end portion, and thus can be stably connected to the second portion 20G.

As described above, in the semiconductor device according to Embodiment 2, a signal can be input to the gate with the gate pattern 20E used as a signal circuit and the gate lead-out portion 52 fixed to the gate pattern 20E. The configuration including the gate pattern 20E and the gate lead-out portion 52 may be used for some of or all of a plurality of gates.

In the semiconductor device according to Embodiment 2 of the present invention, the gate lead-out portion 52 can be fixed to any location of the gate pattern 20E, and thus can be disposed with a higher degree of freedom. The upper portion conductor 20B and the first lower portion conductor 20C are connected to the outside at a portion outside the insulating plate 20A in plan view. The gate lead-out portion 52 can be connected to the outside at a portion right above the insulating plate 20A. Such a degree of freedom thus achieved contributes to the downsizing of the semiconductor device. A signal such as a gate drive signal involves smaller current compared with the main current, and thus the gate lead-out portion 52 and the gate pattern 20E need not to be integrated.

Figure 11:
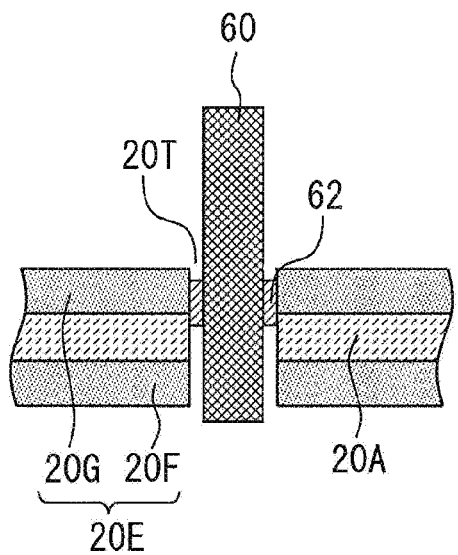
FIG. 11 is a diagram illustrating the gate lead-out portion according to a modification.

FIG. 11 is a diagram illustrating a method of connecting a gate according to a modification. The relay substrate 20 is provided with a through hole 20T. A gate lead-out portion 60 is provided as an external electrode connected to the gate. The gate lead-out portion 60 is provided through the through hole 20T. The gate lead-out portion 60 and the second portion 20G are connected to each other with solder 62 in FIG. 11. Alternatively, the gate lead-out portion 60 may be connected to the first portion 20F in the through hole 20T. The connection method employs a conductive bonding material such as solder, or pressure connection such as press fitting, for example. The shape and the material of the gate lead-out portion 60 may be selected in accordance with the connecting method. The gate lead-out portion 60 illustrated in FIG. 11 has a smaller occupying area in the relay substrate than the gate lead-out portion 52 illustrated in FIG. 10 does, and thus is suitable for downsizing the device.

The lower portion protruding portion 20b, the upper portion protruding portion 20d, and the gate lead-out portion 60 are all fixed to the insulating plate 20A. Thus, the connection of the external terminal and the substrate 15 may be omitted with only the lower portion protruding portion 20b, the upper portion protruding portion 20d, and the gate lead-out portion 60 used as the conductors extending outside the resin 40. Thus, the substrate 15 may be downsized from that in a case where the external terminal and the substrate 15 are connected. With the connection of the external terminal and the substrate 15 omitted, the semiconductor device can be easily assembled.

Embodiment 3

Figure 12:
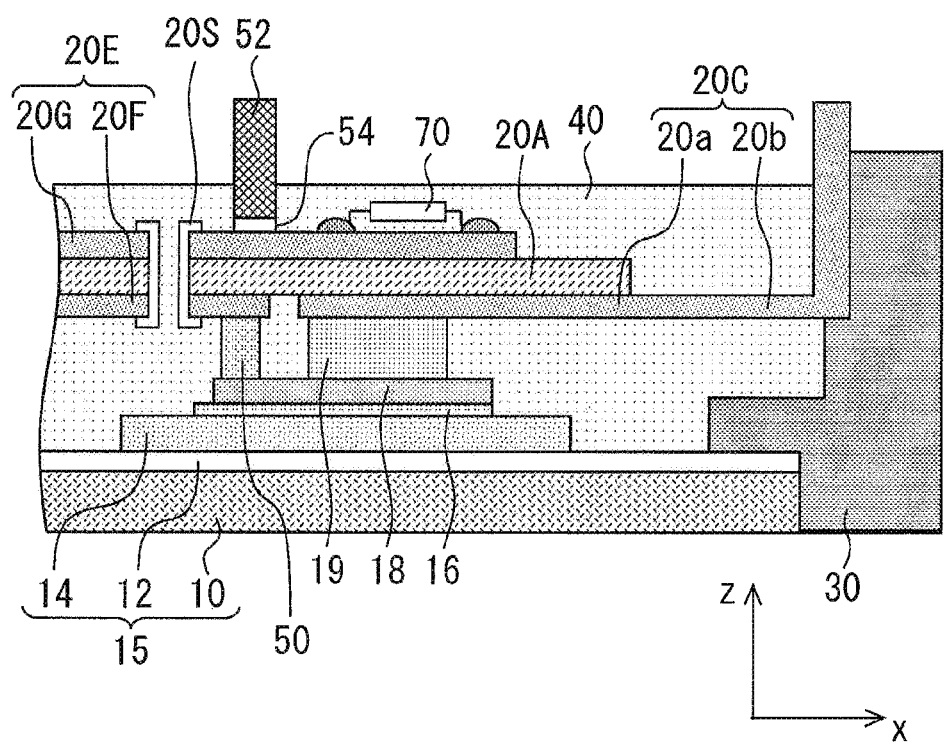
FIG. 12 is a partial cross-sectional view of a semiconductor device according to Embodiment 3.

FIG. 12 is a partial cross-sectional view of a semiconductor device according to Embodiment 3. An electronic component 70 is fixed to the insulating plate 20A. The electronic part 70 is a resistor, a capacitor, a control integrated circuit (IC), or the like, and is fixed to the conductor on the upper side of the insulating plate 20A, the conductor on the lower side of the insulating plate 20A, or the insulating plate 20A. The electronic component 70 is provided to additionally provide a function of protecting the semiconductor chip 18 or the semiconductor device. Thus, the electronic component, which is provided outside the semiconductor device in conventional configurations, serves as an active component fixed to the relay substrate 20, whereby improved functionality and reliability of the semiconductor device can be achieved. The electronic component 70 may be provided not only on the upper or lower surface of the relay substrate 20, but also in the relay substrate 20.

The semifinished product in which the substrate 15, the semiconductor chip 18, and the relay substrate 20 are assembled may be encapsulated with resin 40, without using the casing. In such a case, a mold is used as an outer frame. The resin is injected in the mold with low injection pressure of about 10 to 15 MPa under a vacuum environment. Thus, an extremely small space between the substrate 15 and the relay substrate 20 can be filled with the resin. The mold can be completely filled with resin including a low stress agent, when the resin is injected in the mold with low pressure. The resin including the low stress agent can achieve a lower stress generated in the solder 19, the semiconductor chip 18, and the like, thereby enhancing the reliability of the semiconductor device. The outer shape of the semiconductor device can be defined by using the mold and without using the casing, whereby cost reduction can be achieved. The resin 40 is exposed on the side surfaces of the semiconductor device when being formed without using the casing.

The features of the semiconductor devices according to the embodiments described above may be combined as appropriate to enhance the effects of the present invention.

In the present invention, a relay substrate in which a circuit pattern and an external electrode are integrated is used, whereby a small resistance can be achieved in a current path while preventing the problems occurring when the external electrode is soldered on the semiconductor chip.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a substrate;
   a plurality of semiconductor chips fixed on the substrate;
   an insulating plate in which a through hole is formed;
   a first lower portion conductor as a single conductor including a lower portion main body that is formed on a lower surface of the insulating plate and is electrically connected to one of the plurality of semiconductor chips, and a lower portion protruding portion that extends outside the insulating plate in plan view;
   a second lower portion conductor that is formed on a lower surface of the insulating plate and is electrically connected to one of the plurality of semiconductor chips;
   an upper portion conductor as a single conductor including an upper portion main body formed on the upper surface of the insulating plate, and an upper portion protruding portion extending outside the insulating plate in plan view;
   a connecting portion provided in the through hole and connects between the upper portion main body and the second lower portion conductor; and
   resin that covers the semiconductor chips and the insulating plate, wherein
   the lower portion protruding portion and the upper portion protruding portion extend outside the resin.

2. The semiconductor device according to claim 1, wherein
   the plurality of semiconductor chips include a transistor chip including a collector, an emitter, and a gate, and
   the lower portion main body and the second lower portion conductor are electrically connected to the collector or the emitter.

3. The semiconductor device according to claim 2, wherein a portion where the lower portion main body and the upper portion main body overlap in plan view is provided to cause collector current and emitter current of the transistor chip flow in opposite directions in plan view.

4. The semiconductor device according to claim 1, wherein the semiconductor chips and the lower portion main body are connected to each other with a conductive bonding material having a thickness of 1 mm or smaller.

5. The semiconductor device according to claim 1, wherein
   the plurality of semiconductor chips include a transistor chip including a collector, an emitter, and a gate,
   the semiconductor device further comprising:
   a gate pattern that is formed on the insulating plate and is electrically connected to the gate; and
   a gate lead-out portion that is connected to the gate pattern and extends outside the resin.

6. The semiconductor device according to claim 5, wherein the gate lead-out portion is fixed to the gate pattern with a conductive bonding material provided on the gate pattern.

7. The semiconductor device according to claim 5, wherein the gate lead-out portion is provided through the through hole provided on the insulating plate.

8. The semiconductor device according to claim 6, wherein the lower portion protruding portion, the upper portion protruding portion, and the gate lead-out portion are only conductors extending outside the resin.

9. The semiconductor device according to claim 1, further comprising an electronic component fixed on the insulating plate, the first lower portion conductor, the second lower portion conductor, or the upper portion conductor.

* * * * *